(12) United States Patent
Czerniak

(10) Patent No.: US 7,445,023 B2
(45) Date of Patent: Nov. 4, 2008

(54) APPARATUS FOR CONVEYING GASES TO AND FROM A CHAMBER

(75) Inventor: Michael Roger Czerniak, Partridge Green (GB)

(73) Assignee: Edwards Limited, Crawley, West Sussex (GB)

( * ) Notice: Subject to any disclaimer, the term of this patent is extended or adjusted under 35 U.S.C. 154(b) by 218 days.

(21) Appl. No.: 10/574,036

(22) PCT Filed: Sep. 24, 2004

(86) PCT No.: PCT/GB2004/004121

§ 371 (c)(1),
(2), (4) Date: Mar. 27, 2006

(87) PCT Pub. No.: WO2005/031032

PCT Pub. Date: Apr. 7, 2005

(65) Prior Publication Data

US 2006/0289071 A1 Dec. 28, 2006

(30) Foreign Application Priority Data

Sep. 26, 2003 (GB) ................................. 0322602.4

(51) Int. Cl.
*B67D 5/00* (2006.01)
(52) U.S. Cl. ............. 137/597; 137/599.03; 137/599.11; 118/715
(58) Field of Classification Search ...................... 34/92; 118/715; 137/597, 599.03, 599.11; 427/255.28
See application file for complete search history.

(56) References Cited

U.S. PATENT DOCUMENTS 5,250,323 A  10/1993 Miyazaki 6,016,611 A  1/2000 White et al.

(Continued)

FOREIGN PATENT DOCUMENTS

EP      0 651 432 B1     5/1995

(Continued)

OTHER PUBLICATIONS

United Kingdom Search Report of Application No. GB 0322602.4; Date of search: Jan. 20, 2004.

(Continued)

*Primary Examiner*—Stephen M Hepperle
(74) *Attorney, Agent, or Firm*—Ira Lee Zebrak

(57) ABSTRACT

Apparatus comprising: a chamber having a chamber inlet and a chamber outlet; a first inlet for receiving a first gas stream; a second inlet for receiving a second gas stream; a first outlet for outputting the first gas stream to a first vacuum pump; a second outlet for outputting the second gas stream to a second vacuum pump; a conduit network for connecting the first inlet to the first outlet and for connecting the second inlet to the second outlet such that, for each gas stream, first and second flow paths are defined between its respective inlet and outlet, the first flow path passing through the chamber inlet and the chamber outlet, and the second flow path by-passing the chamber, and means for routing the gas streams through the network such that when one gas stream flows along its first flow path, the other gas stream flows along its second flow path.

6 Claims, 2 Drawing Sheets

U.S. PATENT DOCUMENTS 6,263,587 B1 * 7/2001 Raaijmakers et al. ......... 34/404
6,461,436 B1 * 10/2002 Campbell et al. ........... 118/715

FOREIGN PATENT DOCUMENTS

| EP | 0 671 484 A1 | 9/1995 |
| --- | --- | --- |
| EP | 0 959 149 A3 | 11/1999 |
| WO | WO 03/033762 A1 | 4/2003 |
| WO | WO 03/087429 A1 | 10/2003 |

OTHER PUBLICATIONS

PCT International Search Report of International Application No. PCT/GB2004/004121; Date of mailing of the International Search Report: May 24, 2005.

PCT Written Opinion of the International Searching Authority of International Application No. PCT/GB2004/004121; Date of mailing: May 24, 2005.

* cited by examiner

APPARATUS FOR CONVEYING GASES TO AND FROM A CHAMBER

FIELD OF THE INVENTION

This invention relates to apparatus for conveying gases to and from a process chamber such as vent-run gas switching systems commonly used in atomic layer deposition (ALD) or chemical vapour deposition (CVD) techniques. In particular, the invention relates to an improvement to such systems which reduces the opportunity for cross-reaction between gases in such a system.

BACKGROUND OF THE INVENTION

Vent-run gas switching systems are commonly used in the growth of multi-layer thin films. Two common example applications are the manufacture of $Al_2O_3$ and TiN films. In such applications, sources of two or more gaseous species to be deposited are provided. A purge gas source may also be provided. The gases are delivered to a process chamber, sequentially, by means of a switching system between the gas sources and the process chamber. Any residual species, purge gas or by-products are exhausted from the process chamber by a pump.

Typically, purge gas is passed through the reaction chamber between supplies of the species to be deposited. The purpose of the purge gas is to remove any residual (not deposited) species from the process chamber so as to prevent reaction with the next species supplied to the chamber. Were the species allowed to cross react, this might result in impurities and imperfections in the multi-layer film.

In existing vent-run gas switching systems, gases leaving the process chamber enter a common foreline leading to a vacuum pump. Cross reaction of any residual species can occur in the foreline and this can result in the accumulation of particulates in the foreline leading to impaired pump performance. Such impairment of pump performance may compromise the quality of the product manufactured in the process chamber. In addition, the process down time involved in repairing and maintaining affected pumps can increase the costs of manufacture.

The present invention aims to provide apparatus wherein cross reaction of species on exhaust from the process chamber is significantly reduced.

BRIEF SUMMARY OF THE INVENTION

According to one aspect of the present invention there is provided apparatus comprising:
  a chamber having a chamber inlet and a chamber outlet;
  a first inlet for receiving a first gas stream;
  a second inlet for receiving a second gas stream;
  a first outlet for outputting the first gas stream to a first vacuum pump;
  a second outlet for ouputting the second gas stream to a second vacuum pump;
  a conduit network for connecting the first inlet to the first outlet and for connecting the second inlet to the second outlet such that, for each gas stream, first and second flow paths are defined between its respective inlet and outlet, the first flow path passing through the chamber inlet and the chamber outlet, and the second flow path by-passing the chamber; and
  means for routing the gas streams through the network such that when one gas stream flows along its first flow path, the other gas stream flows along its second flow path.

A portion of the second flow path for the first gas stream may be common to a portion of the second flow path for the second gas stream. The first flow path for any gas may be isolated from the second flow path for the same gas.

The routing means may comprise a first valve system located within the conduit network, together with means for controlling the first valve system in order to allow the first gas stream to be routed from the first inlet to a selected one of its first and second flow paths. This controller may also be configured to route the second gas stream from the second inlet to a selected one of its first and second flow paths. The routing means may further comprise a second valve system also located within the conduit network, together with means for controlling the second valve system in order to allow the first gas stream to be routed from its selected flow path to the first outlet. This controller may also be configured to route the second gas stream from its selected flow path to the second outlet. In the proposed embodiment, a single controller is provided for controlling both the first and the second valve systems. In an alternative embodiment, separate controllers could be provided for controlling respective valve systems.

The controller may be configured to control the degree of opening of each of the valves of the valve systems, and/or the duration for which each of the valves of the valve systems are opened. Furthermore, the controller may be configured to allow a predetermined delay between opening of valves of the different valve systems to ensure all gas in any common sections of conduit has been exhausted before a new gas is introduced thereto.

A third inlet may be provided for receiving a third gas stream, in which case the conduit network may connect the third inlet to the first outlet such that, for the third gas stream, a first flow path is defined between the third inlet and the first outlet which passes through the chamber inlet and the chamber outlet. The routing means may be configured to route each of the gas streams through the network such that when the third gas stream flows along its first flow path, the first and second gas streams flow along their second flow paths.

Furthermore, the conduit network may connect the third inlet to the first outlet such that, for the third gas stream, a second flow path is defined between the third inlet and the first outlet which by-passes the chamber, the routing means being configured to route each of the gas streams through the network such that when one of the gas streams flows along its first flow path, the other gas streams flows along their second flow paths.

The routing means may comprise a third valve system located within the conduit network, together with means for controlling the third valve system to route the third gas stream from the third inlet to a selected one of its first and second flow paths.

The chamber inlet and the chamber outlet may be configured to provide an even flow distribution over a working section of the chamber.

According to a second aspect of the present invention there is provided apparatus for conveying gases to and from a chamber, the apparatus comprising:
  a first inlet for receiving a first gas stream;
  a second inlet for receiving a second gas stream;
  a first outlet for outputting the first gas stream;
  a second outlet for ouputting the second gas stream;
  a first chamber port connectable to an inlet of the chamber;
  a second chamber port connectable to an outlet of the chamber;
  a conduit network for connecting the first inlet to the first outlet and for connecting the second inlet to the second outlet such that, for each gas stream, first and second flow paths are defined between its respective inlet and outlet, the first flow path passing through the chamber ports, and the second flow path by-passing the chamber ports; and means for routing the gas streams through the network such that when one gas stream flows along its first flow path, the other gas stream flows along its second flow path.

According to a third aspect of the present invention there is provided a method for conveying gases to and from a chamber, comprising the following steps:

connecting to the chamber a conduit network having
a first inlet for receiving a first gas stream;
a second inlet for receiving a second gas stream;
a first outlet for outputting the first gas stream;
a second outlet for ouputting the second gas stream;
a first chamber port connectable to an inlet of the chamber;
a second chamber port connectable to an outlet of the chamber; and
a network of conduits for connecting the first inlet to the first outlet and for connecting the second inlet to the second outlet such that, for each gas stream, first and second flow paths are defined between its respective inlet and outlet, the first flow path passing through the chamber ports, and the second flow path by-passing the chamber ports; and routing the gas streams through the network such that when one gas stream flows along its first flow path, the other gas stream flows along its second flow path.

BRIEF DESCRIPTION OF THE DRAWINGS

For the purposes of exemplification, an embodiment of the invention will now be further described with reference to the Figures in which.

DETAILED DESCRIPTION OF THE INVENTION

Figure 1:
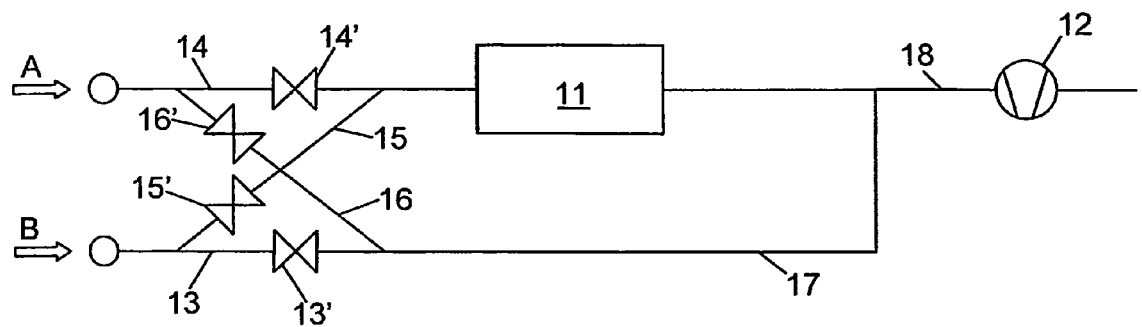
FIG. 1 illustrates a conventional vent-run gas switching system.

As can be seen from FIG. 1 a prior art vent-run gas switching system comprises two gas supplies A and B, each connected to a process chamber 11 and pump 12 by means of a series of valved conduits 13-18. The conduits 13 to 16 include valves 13' to 16' which can be operated to control the flow of the gases A, B to the pump 12 either via the process chamber 11, or via conduit 17 which bypasses the process chamber 11. Thus, only one of the gases A, B is supplied to the chamber at any one time.

To supply the first gas A to the chamber 11, valve 14' is opened, the first gas A flows directly through conduit 14, into the chamber 11 and exhausts through conduit 18 to pump 12. During delivery of the first gas A, valves 15' and 16' remain closed whilst valve 13' is open. The second gas B therefore flows through conduits 13, 17 and 18 to the pump 12, by-passing the chamber 11. To supply the second gas B to the chamber 11, valves 15' and 16' are opened and valves 13' and 14' are closed. In this configuration, the second gas B is supplied through conduit 15 to the chamber 11 and exhausted via conduit 18 to the pump 12.

Meanwhile, the first gas A is supplied through conduits 16, 17 and 18 directly to the pump 12, bypassing the chamber 11 entirely.

It will be appreciated that, as both gases A, B pass through conduit 18 adjacent to the pump and exhaust to the single pump 12, there is scope for cross reaction between any residual of gas remaining in this area after switching between the gas supplies has been effected.

Figure 2:
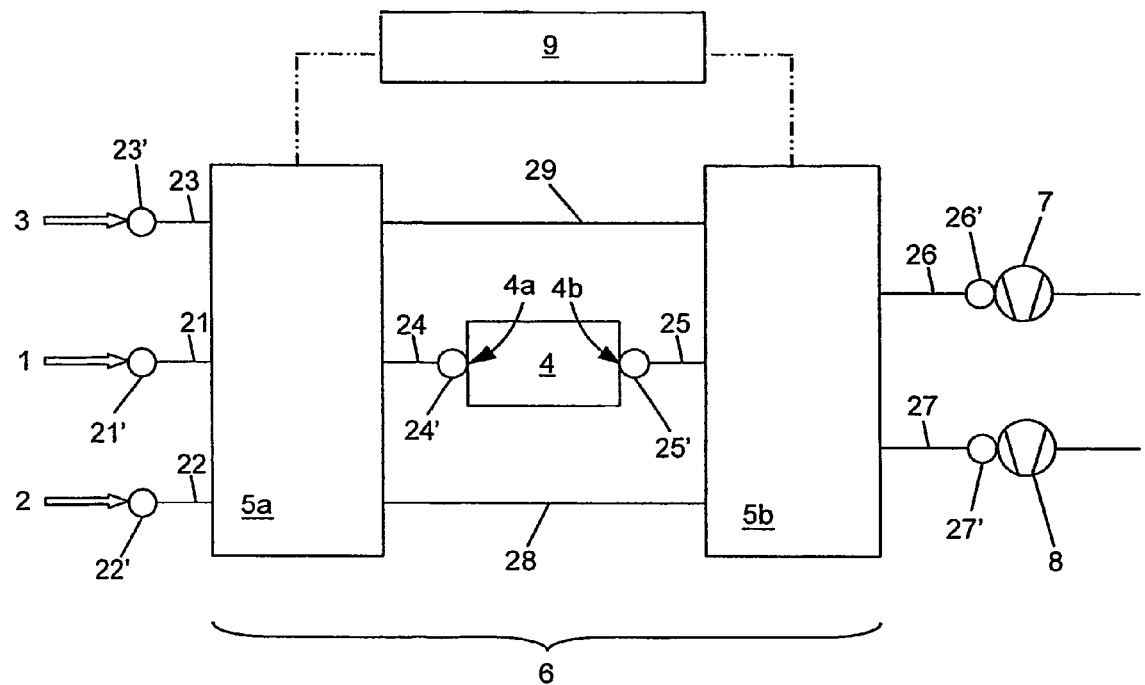
FIG. 2 illustrates apparatus for supplying process and purge gases to a chamber.

FIG. 2 illustrates an alternative, improved apparatus for supplying gases to a process chamber.

As can be seen from FIG. 2, apparatus is illustrated that can supply three different gases 1, 2, 3 to the process chamber 4. Typically, one of the gases 3 is a purge gas and the other two gases 1,2 are process gases to be reacted in the process chamber 4 for example, to form a multi-layer semi-conductor product, or a multi-layered insulator. Each gas supply is connected to the process chamber 4 and one of two pumps 7, 8 by means of a conduit network 6 positioned therebetween. The conduit network 6 is connected at an upstream end to sources of each of the required gases 1, 2, 3 by a respective inlet conduit 21, 22, 23 which serve to deliver the gases 1, 2, 3 to the network 6. The network 6 is connected at a downstream end to vacuum pumps 7, 8 by outlet conduits 26, 27 to enable the exhausting of gas thereto.

In this example, three main flow paths are provided by the network 6 between the inlets 21, 22, 23 and the outlets 26, 27. The first path is configured such that it passes through the process chamber 4. One conduit 24 is provided upstream of the chamber 4, the end of this conduit 24 forming a port 24' that is connected to an inlet 4a of the chamber. A second conduit 25 is provided downstream of the chamber 4, the end of conduit 25 forms a further port 25' that is connected to an outlet 4b of the chamber. The second and third paths of this example are provided by two bypass conduits 28, 29. These conduits provide an alternative path for gases that are not required by the process being carried out within the chamber at any one time. Typically the number of distinct flow paths provided by the network 6 matches the number of gases being supplied to the network (here there are three).

The network 6 comprises two banks of switching valves 5a and 5b arranged to route each of the gases 1, 2, 3 along the three separate fluid paths provided by the network 6 as described above. These valves are preferably fast actuating valves, such as solenoid valves, to effect rapid switching of the different gases 1, 2, 3 from one fluid path to another. A controller 9 is provided in communication with each of these banks 5a, 5b to permit automatic switching of the individual valves in accordance with the particular process being carried out in the process chamber 4. The controller 9 can initiate actuation of the different valves in any particular sequence but may also govern the timing of this actuation, the duration for which any particular valve is opened and the degree of opening of any particular valve. The timing may be arranged to permit one bank 5a to be actuated prior to the other bank 5b to ensure that the gases present in one flow path are evacuated before a subsequent gas is introduced into that part of the network.

Figure 3:
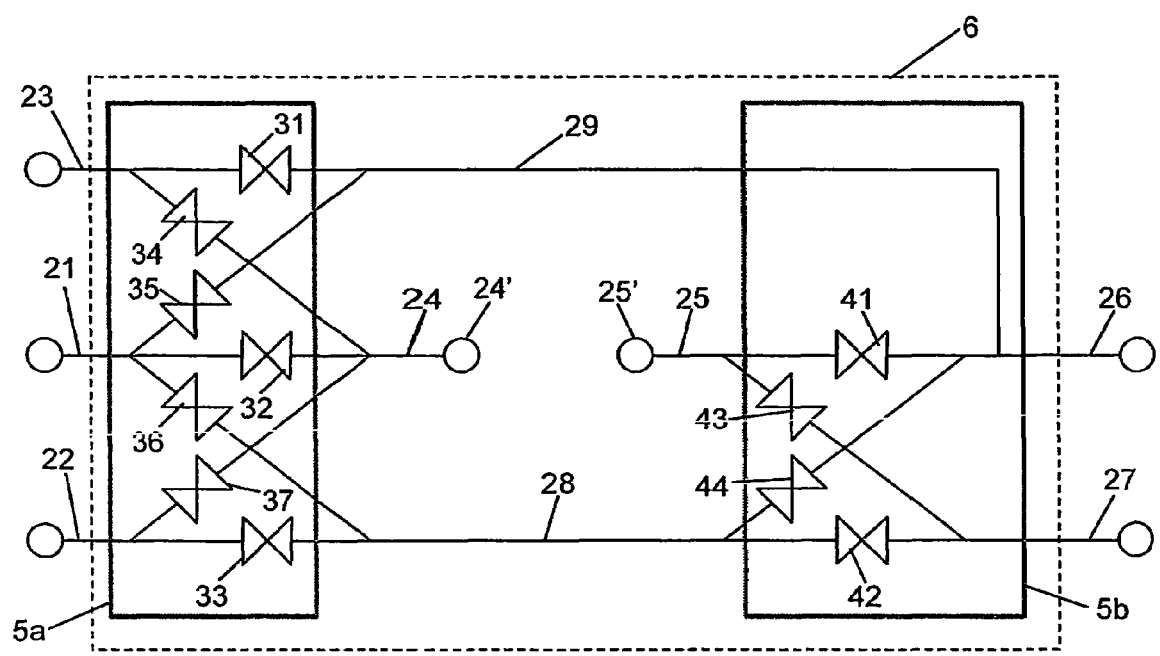
FIG. 3 illustrates the routing mechanism of the apparatus of FIG. 2 in more detail.

One particular configuration of the valves and conduits that make up the network 6 is illustrated in FIG. 3 and will be described below in reference to the operation thereof.

As illustrated in FIG. 2, each inlet conduit 21, 22, 23 defines an inlet port 21', 22', 23' into the network, similarly each outlet conduit 26, 27 defines an outlet port 26' 27' out of the network. For clarity in FIG. 3 only the conduits are indicated.

Each gas 1, 2, 3 is initially supplied into a respective inlet conduit 21, 22, 23.

Where the first process gas 1 is being provided to the chamber 4 (from FIG. 2), valves 31, 32, 33, 41 and 42 are opened and the remaining valves are closed. This permits the first gas 1 to pass from inlet 21, through valve 32, through conduit 24 and into the process chamber 4 via chamber inlet 4a. Any residual gas 1, not consumed in the processing step passes out of the process chamber 4 via chamber outlet 4b, into conduit 25 and from there to pump 7 through valve 41 and outlet conduit 26.

Meanwhile, the second process gas 2 passes directly from inlet 22 through valve 33, conduit 28 and valve 42 to outlet 27 where it is exhausted to vacuum pump 8. Hence, it bypasses the process chamber 4 entirely and does not mix with the first process gas 1. The third gas, here purge gas 3, passes directly from its respective inlet 23 through valve 31 and conduit 29 to outlet 26, which it shares with the first process gas 1, from where it is exhausted to vacuum pump 7. This sharing can occur between any gases that do not interact to form the aforementioned deposits or by-products with particularly corrosive characteristics that could be detrimental to the performance or even to the operation of the vacuum pump 7, 8.

Typically, the next gas to be introduced to the chamber 4 is the purge gas 3, so valves 31 and 32 of the first switch hank 5a are closed by the controller 9 whilst at the same time valves 34 and 35, also of switch bank 5a, are opened. In this way, the second process gas 2 remains unaffected and passes directly from its inlet 22 to its outlet 27 as before, but the first process gas 1 and the purge gas 3 swap flow paths. Namely, the first process gas 1 is now routed from inlet 21 through valve 35 and bypass conduit 29 to outlet 26 where it is exhausted to vacuum pump 7. Meanwhile, the purge gas 3 is routed from inlet 23 through valve 34 and conduit 24 into the process chamber 4 via chamber inlet 4a. The purge gas 3 is then routed out of the process chamber 4 via chamber outlet 4b into conduit 25 through valve 41 to the outlet 26 where it is exhausted to vacuum pump 7.

A subsequent step may involve delivery of the second process gas 2 to the process chamber. In which case, each of the gases 1, 2, 3 needs to be moved to a new flow path and so nearly all of the valves from both switch banks 5a, 5b must be actuated simultaneously. Valves 34, 35, 33, 41 and 42 are closed by the controller 9 whilst valves 31, 36, 37, 43 and 44 are opened, thus defining a new set of three flow paths. The primary flow path provides the second process gas 2 to the process chamber 4. The second gas 2 is routed from its inlet 22 through valve 37 and conduit 24 to the process chamber 4 via chamber inlet 4a where it performs its function in relation to the wafer being generated in the process chamber. Any residual gas 2 is then passed from the process chamber 4 via chamber outlet 4b through conduit 25 and valve 43 to outlet 27, from where it is exhausted to vacuum pump 8. The first of the bypass routes in this configuration conveys the first process gas 1 from inlet 21 through valve 36, conduit 28 and valve 44 to its respective outlet 26. The second bypass route conveys the third gas, here the purge gas 3, from inlet 23 through valve 31 and conduit 29 to outlet 26 where it mixes with the first gas 1 as it is exhausted to vacuum pump 7.

Thus it can be seen, by suitable operation of the switch valves 31 to 37 and 41 to 44, by controller 9, each of the three gases 1, 2, 3 is provided with two respective flow paths, namely a first flow path that passes through the chamber 4 and a second flow path that bypasses the chamber 4. This can enable the gases to be sequentially and individually supplied to the process chamber 4 whilst allowing each of the reactive process gases 1 and 2 to be conveyed to a respective pump 7, 8. As these process gases 1, 2 are diverted to a given pump 7, 8 before they reach the pump foreline (which is located down stream of the associated outlet 26, 27), there is no opportunity for cross reaction and consequent particulate contamination of the pumps 7, 8.

It will be appreciated that the described arrangement can easily be extended for more than two reactive gases by adding further bypass conduits together with associated valves to the appropriate switch banks 5a, 5b. The number of pumps can also be increased to permit separation of gases which when combined would produce corrosive by-products or form particulate deposits that would be detrimental to the operation and performance of the pumps. It will further be appreciated that separate pumps are only needed where any given two or more gases will cross react with each other. Any two or more gases which will not cross react, can safely be directed to a single pump using the type of arrangements described above.

By rerouting or diverting the gases from one fluid path to another, the delivery of each of the gases can remain a constant, steady state, stream rather than having to be pulsed on and off continuously. This serves to reduce transient properties of the fluid stream. Furthermore, by providing a single inlet 4a and outlet 4b to the process chamber 4 it can be seen that the system itself is configured to minimise transient behaviour of the gas flow over the working section of the chamber.

Further reductions in gas flow transient characteristics can be achieved by provision of balanced flow paths, namely where the lengths and cross sectional areas of the different flow paths are comparable to each other.

It is beneficial to reduce such transient behaviour as much as possible to allow the wafer to be exposed to the process gases for a minimum amount of time, thus increasing throughput of the tool and minimising the consumables required.

I claim:

1. An apparatus for conveying gases to and from a chamber comprising:
    a chamber having a chamber inlet and a chamber outlet;
    a first inlet for receiving a first gas stream;
    a second inlet for receiving a second gas stream;
    a first outlet for outputting the first gas stream to a first vacuum pump;
    a second outlet for outputting the second gas stream to a second vacuum pump;
    a conduit network for connecting the first inlet to the first outlet and for connecting the second inlet to the second outlet such that, for each gas stream, first and second flow paths are defined between its respective inlet and outlet, the first flow path passing through the chamber inlet and the chamber outlet, and the second flow path by-passing the chamber;
    means for routing the gas streams through the network such that when one gas stream flows along its first flow path, the other gas stream flows along its second flow path; and
    wherein part of the second flow path for the first gas stream is common to the second flow path for the second gas stream.

2. An apparatus for conveying gases to and from a chamber comprising:
    a chamber having a chamber inlet and a chamber outlet;
    a first inlet for receiving a first gas stream;
    a second inlet for receiving a second gas stream;
    a first outlet for outputting the first gas stream to a first vacuum pump;
    a second outlet for outputting the second gas stream to a second vacuum pump;
    a conduit network for connecting the first inlet to the first outlet and for connecting the second inlet to the second outlet such that, for each gas stream, first and second flow paths are defined between its respective inlet and outlet, the first flow path passing through the chamber inlet and the chamber outlet, and the second flow path by-passing the chamber;

means for routing the gas streams through the network such that when one gas stream flows along its first flow path, the other gas stream flows along its second flow path;

a third inlet for receiving a third gas stream, and wherein the conduit network connects the third inlet to the first outlet such that, for the third gas stream, a first flow path is defined between the third inlet and the first outlet which passes through the chamber inlet and the chamber outlet; and wherein the conduit network connects the third inlet to the first outlet such that, for the third gas stream, a second flow path is defined between the third inlet and the first outlet which by-passes the chamber, the routing means being configured to route the gas streams through the network such that when one of the gas streams flows along its first flow path, the other gas streams flows along their second flow paths.

3. The apparatus according to claim 2 wherein the routing means comprises a third valve system located within the conduit network, and means for controlling the third valve system to route the third gas stream from the third inlet to a selected one of its first and second flow paths.

4. An apparatus for conveying gases to and from a chamber comprising:

a first inlet for receiving a first gas stream;
a second inlet for receiving a second gas stream;
a first outlet for outputting the first gas stream;
a second outlet for outputting the second gas stream;
a first chamber port connectable to an inlet of the chamber;
a second chamber port connectable to an outlet of the chamber;
a conduit network for connecting the first inlet to the first outlet and for connecting the second inlet to the second outlet such that, for each gas stream, first and second flow paths are defined between its respective inlet and outlet, the first flow path passing through the chamber ports, and the second flow path by-passing the chamber ports;
means for routing the gas streams through the network such that when one gas stream flows alone its first flow path, the other gas stream flows along its second flow path; and wherein part of the second flow path for the first gas stream is common to the second flow path for the second gas stream.

5. An apparatus for conveying gases to and from a chamber comprising:

a first inlet for receiving a first gas stream;
a second inlet for receiving a second gas stream;
a first outlet for outputting the first gas stream;
a second outlet for outputting the second gas stream;
a first chamber port connectable to an inlet of the chamber;
a second chamber port connectable to an outlet of the chamber;
a conduit network for connecting the first inlet to the first outlet and for connecting the second inlet to the second outlet such that, for each gas stream, first and second flow paths are defined between its respective inlet and outlet, the first flow oath passing through the chamber ports, and the second flow path by-passing the chamber ports;
means for routing the gas streams through the network such that when one gas stream flows alone its first flow path, the other gas stream flows along its second flow path;
a third inlet for receiving a third gas stream, and wherein the conduit network connects the third inlet to the first outlet such that, for the third gas stream, a first flow path is defined between the third inlet and the first outlet which passes through the first and second chamber ports; and
wherein the conduit network connects the third inlet to the first outlet such that, for the third gas stream, a second flow path is defined between the third inlet and the first outlet which by-passes the chamber ports, the routing means being configured to route the gas streams through the network such that when one of the gas streams flows along its first flow path, the other gas streams flows along their second flow paths.

6. The apparatus according to claim 5 wherein the routing means comprises a third valve system located within the conduit network, and means for controlling the third valve system to route the third gas stream from the third inlet to a selected one of its first and second flow paths.

* * * * *